(12) United States Patent
Onose et al.

(10) Patent No.: US 7,768,066 B2
(45) Date of Patent: Aug. 3, 2010

(54) SEMICONDUCTOR DEVICE AND ELECTRICAL CIRCUIT DEVICE USING THEREOF

(75) Inventors: Hidekatsu Onose, Hitachi (JP); Hiroyuki Takazawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 180 days.

(21) Appl. No.: 12/179,549

(22) Filed: Jul. 24, 2008

(65) Prior Publication Data
US 2009/0032821 A1 Feb. 5, 2009

(30) Foreign Application Priority Data
Jul. 30, 2007 (JP) .............................. 2007-197630

(51) Int. Cl.
*H01L 29/94* (2006.01)
(52) U.S. Cl. ....................... 257/330; 257/329
(58) Field of Classification Search .................. 257/329, 257/330
See application file for complete search history.

(56) References Cited

FOREIGN PATENT DOCUMENTS

JP 10-098188 A 4/1998

*Primary Examiner*—Douglas M Menz
(74) *Attorney, Agent, or Firm*—Miles & Stockbridge P.C.

(57) ABSTRACT

A UMOSFET is capable of reducing a threshold voltage and producing a large saturation current. A typical UMOSFET according to the present invention includes: an $N^+$ type SiC substrate constituting a drain layer; an $N^-$ type SiC layer that is in contact with the drain layer and constitutes a drift layer; a P type body layer formed on the drift layer and being a semiconductor layer; an $N^+$ type SiC layer constituting a source layer; a trench extending from the source layer to a predetermined location placed in the drift layer; a P type electric field relaxation region provided around and outside a bottom portion of the trench; and a channel region extending from the $N^+$ type source layer to the P type electric field relaxation region and having an impurity concentration higher than that of the $N^-$ type drift layer and lower than that of the P type body layer.

17 Claims, 10 Drawing Sheets

SEMICONDUCTOR DEVICE AND ELECTRICAL CIRCUIT DEVICE USING THEREOF

CLAIM OF PRIORITY

The present application claims priority from Japanese patent application JP 2007-197630 filed on Jul. 30, 2007, the content of which is hereby incorporated by reference into this application.

BACKGROUND OF THE INVENTION

1. Field of the Invention

The present invention relates to a semiconductor device, and more particularly to a semiconductor device suitable for a metal oxide field effect transistor (MOSFET) or an insulated gate bipolar transistor (IGBT).

2. Description of the Related Art

When an inverter circuit is composed of a MOSFET or an IGBT, the inverter circuit has a mode in which a current flows in a reverse direction due to inductance of a motor or the like used as a load under the condition that switching devices are in an off state. When an inverter circuit is composed of junction field effect transistors (JFETs), it is therefore necessary that a diode for causing the current to flow back be connected in inverse parallel relationship with each JFET in the inverter circuit. This results in an increase in the cost. In addition, the downsizing of a package is limited. Therefore, a MOSFET or an IGBT is used generally as a switching device of an inverter.

On the other hand, silicon carbide (SiC) has a breakdown electric field than larger by approximately 10 times than that of silicon (Si), and is a material allowing a high voltage resistance drift layer to have a small thickness and a high concentration. Losses of MOSFETs using SiC are lower than those of MOSFETs using Si. The MOSFETs using Sic have been expected as destruction-resistant devices. Especially, a U-shaped metal oxide semiconductor field effect transistor (UMOSFET) using a sidewall of a trench as a channel has an advantage to shrink the device size. Power MOSFETs using Si have been manufactured. Each of the power MOSFETs has a structure capable of reducing an on-state voltage. When the UMOSFET uses SiC, the UMOSFET has a large breakdown electric field. Therefore, a large electric field may occur on a gate oxide film formed on a corner portion of a trench provided in the UMOSFET, and the UMOSFET may be broken. To avoid this problem, a technique for preventing an electric field from being concentrated is used. FIG. 19 schematically shows a cross sectional structure of a conventional, typical UMOSFET using SiC. In the example shown in FIG. 19, a region for relaxing the concentration of an electric field on an oxide film is formed around a bottom portion of a trench. In FIG. 19, reference numeral 10 denotes an N$^+$ type wafer; 11, an N$^-$ type drift layer; 12, a P type body; 13, an N$^+$ type source layer; 14, a P$^+$ type region for forming a contact with the P type body; 17, a gate oxide film; 31, a drain electrode; 32, a silicide electrode forming an ohmic contact between the N$^+$ type source layer 13 and the P$^+$ region 14; 33, a source electrode; and 34, a gate electrode. The UMOSFET shown in FIG. 19 has a P$^+$ type region 16 provided around the bottom portion of the trench. The P$^+$ type region 16 is adapted to relax the concentration of the electric field. The UMOSFET has a structure capable of preventing an excessive electric field from being generated on the oxide film formed on a corner portion of the trench. Such a structure is disclosed in, for example, JP-A-H10-98188.

SUMMARY OF THE INVENTION

FIG. 19 schematically shows a spread of a depletion layer in a thermal equilibrium state in which a voltage is not applied to any of the drain electrode, the gate electrode and the source electrode, or in which potentials of the drain electrode, the gate electrode and the source electrode are the same.

In the abovementioned example, when the distance between the electric field relaxation P$^+$ type region 16 and the P type body 12 is small, the depletion layer 20 spreading around the electric field relaxation P$^+$ type region 16 and the depletion layer spreading in the N$^-$ type drift layer 11 may be integrated with each other. In order to cause a current to flow between the drain electrode and the source electrode, it is necessary that a channel layer, in which a current flows, be formed. To cause the current to flow in the channel layer, the following are performed: a voltage is applied to the gate electrode; and a portion of the P type body 12, which is located at the boundary between the P type body 12 and the oxide film formed on a sidewall of the trench, is reversed to an N type body; and electrons are accumulated in the boundary between the N$^-$ type drift layer 11 and the oxide film formed on the sidewall of the trench. Under the condition that the depletion layers are integrated with each other, the minimum gate voltage necessary for forming the channel layer, i.e., a threshold voltage is large. For example, when the gate oxide film 17 has a thickness of 75 nm, the concentration of the P type body 12 is $1\times10^{18}$ cm$^{-3}$, and the distance between the electric field relaxation P$^+$ type region 16 and the P type body 12 is 0.5 µm, the threshold voltage is 18 V. To achieve the on-state of the channel, the gate voltage of 25 V is necessary. As a result, an electric field generated on the oxide film is large. This results in low reliability. In addition, since the channel is pinched off even when a low drain voltage is applied, a saturation current is reduced. To avoid this, the distance between the electric field relaxation P$^+$ type region 16 and the P type body 12 is set to be large so that the depletion layers are not integrated with each other. In this case, however, the length of the channel is large, and resistance of the channel is increased. This results in an increase in the on-state voltage and prevention of an increase in the saturation current. It should be noted that the state in which the depletion layers are integrated with each other can be understood with reference to FIG. 10.

It is, therefore, an object of the present invention to provide the structure of a UMOSFET ensuring reliability of a gate oxide film and achieving a large saturation current with a low threshold voltage.

The basic configuration of a semiconductor device according to the present invention is as follows. According to a first aspect of the prevent invention, the semiconductor device at least includes: a first semiconductor layer of a first conductivity type; a second semiconductor layer formed on the first semiconductor layer, having a lower impurity concentration than that of the first semiconductor layer, and constituting a drift region of the first conductivity type; a third semiconductor layer of a second conductivity type opposite to the first conductivity type, the third semiconductor being formed on the second semiconductor layer, a junction being formed between the second semiconductor layer and the third semiconductor layer; a fourth semiconductor layer of the first conductivity type, the fourth semiconductor layer being formed on the third semiconductor layer; a trench at least extending through the third semiconductor layer and forming a recessed portion connected with the second semiconductor layer; an insulating layer formed on a side surface and a bottom surface of the trench; a semiconductor region of the second conductivity type, the semiconductor region being formed in the second semiconductor layer and located around and outside a bottom portion of the trench; a channel region of the first conductivity type, the channel region being formed on the side surface of the trench, extending from the fourth semiconductor layer to the semiconductor region provided in the second semiconductor layer and having a higher impurity concentration than that of the second semiconductor layer constituting the drift region; and a gate electrode insulated by the insulating layer formed on the side surface and the bottom surface of the trench, at least a part of the gate electrode being formed in the trench.

According to a second aspect of the present invention, in the semiconductor device, it is useful that a depletion layer spreading from the third semiconductor layer of the second conductivity type to the second semiconductor layer (constituting the drift region) of the first conductivity type and a depletion layer spreading from the semiconductor region (formed in the second semiconductor layer) of the second conductivity type to the second semiconductor layer constituting the drift region are separated from each other in a thermal equilibrium state.

The semiconductor region of the second conductivity type, which is located in the second semiconductor layer and around and outside the bottom portion of the trench, is an electric field relaxation region. That is, the electric field relaxation region prevents an excessive electric field from being generated on an oxide film formed on a corner portion of the trench. The electric field relaxation region may have a known structure. The trench according to the present invention may be a groove described below in detail, any one of various types of holes and recessed portions.

It is useful that the semiconductor device according to the present invention uses a MOSFET or an IGBT. The configuration of the semiconductor device using a MOSFET or an IGBT is described below.

According to a third aspect of the present invention, in the semiconductor device according to the first or second aspect, the first semiconductor layer is a drain region or a source region. When the first semiconductor layer is the drain region, the fourth semiconductor layer is a source region. When the first semiconductor layer is the source region, the fourth semiconductor layer is a drain region.

In addition, each of the semiconductor devices according to the first to third aspects is highly suitable for practical use when each of the first to fourth semiconductor layers is made of SiC.

From the perspective of voltage resistance of the semiconductor device according to the first to third aspects, a practical approach is to set the impurity concentration of the channel region to be lower than that of the third semiconductor layer.

The semiconductor device according to the present invention is preferably used for an electrical circuit device such as a power device, more particularly for an inverter circuit.

The present invention provides the structure of a UMOSFET ensuring reliability of a gate oxide film and achieving a large saturation current with a low threshold voltage.

DETAILED DESCRIPTION OF THE PREFERRED EMBODIMENTS

A principle for obtaining an effect of the present invention will be described prior to explanation of embodiments of the present invention.

A typical example of a semiconductor device disclosed in the present application is as follows. Specifically, the semiconductor device according to the present invention includes:

a drain layer of a first conductivity type, which has a high SiC concentration; a drift layer of the first conductivity type, which is in contact with the drain layer and has a low SiC concentration; a body layer of a second conductivity type, which is formed on the drift layer and has a high SiC concentration; a source layer of the first conductivity type, which is formed on the body layer and has a high SiC concentration; a trench extending from the source layer to a predetermined location placed in the drift layer; an insulating film formed on a side surface and a bottom surface of the trench; an electric field relaxation region of the second conductivity type, which is formed around and outside a bottom portion of the trench; and a channel region of the first conductivity type, which is formed on the side surface of the trench, extends from the source layer to the electric field relaxation region, and has a higher SiC concentration than that of the drift layer.

In short, a UMOSFET according to the present invention has an N type channel region formed at the periphery of the surface of a gate oxide film (formed on a sidewall of the trench) and extending from the $N^+$ type source layer to the P type electric field relaxation region formed around and outside the bottom portion of the trench. Alternatively, in the UMOSFET, a depletion layer spreading from the body layer to the drift layer and a depletion layer spreading from the electric field relaxation region to the drift layer are separated from each other by the channel region in a thermal equilibrium state.

Figure 2:
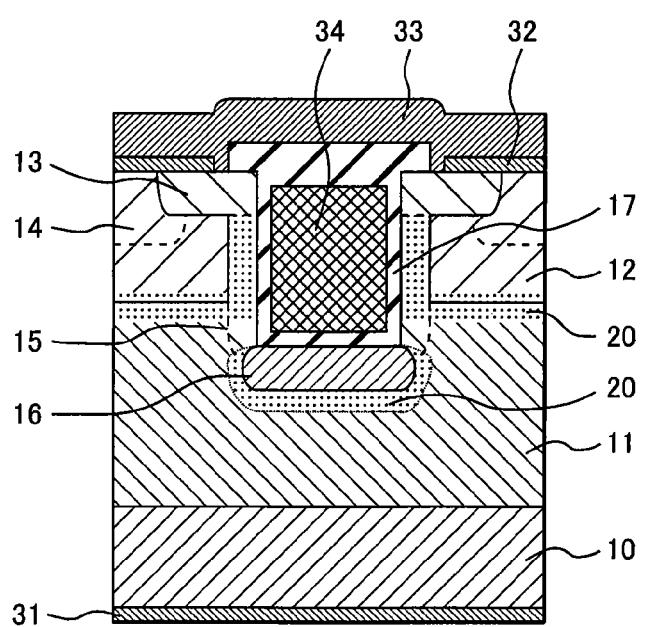
FIG. 2 is a diagram showing spreads of depletion layers under the condition that the UMOSFET shown in FIG. 1 is in a thermal equilibrium state.
Figure 3:
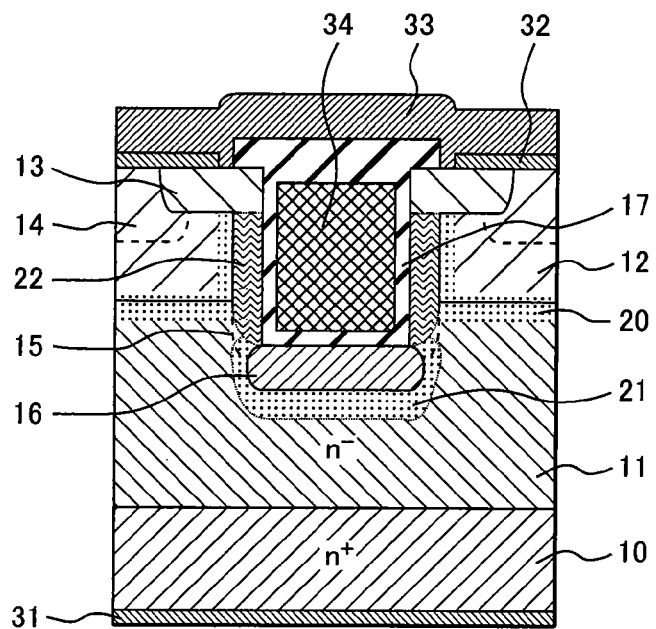
FIG. 3 is a diagram showing a spread of a depletion layer under the condition that the UMOSFET shown in FIG. 1 is in an on state.

FIG. 2 shows spreads of the depletion layers under the condition the UMOSFET according to the present invention is in a thermal equilibrium state. FIG. 3 shows spreads of the depletion layers under the condition the UMOSFET according to the present invention is in an on state. Reference numeral 10 denotes an $N^+$ type wafer constituting a drain layer; 11, an $N^-$ type drift layer; 12, a P type body (P type semiconductor layer); 13, an $N^+$ type source layer; 15, a channel region; 16, a P type semiconductor region (constituting an electric field relaxation region); 14, a $P^+$ type region for forming a contact with the P type body; 17, a gate oxide film; 20, a depletion layer; 31, a drain electrode; 32, a silicide electrode forming an ohmic contact between the $N^+$ type source layer and the $P^+$ type region; 33, a source electrode; and 34, a gate electrode. A current flows through the channel region 15 and between the source electrode 32 and the drain electrode 31. The current is turned on and off by means of the gate electrode 34. The electric field relaxation region 16 is adapted to relax an electric field generated at a corner portion of the trench. The electric field relaxation region 16 is similar to that used in a conventional technique, and detail description thereof is omitted.

The most important characteristic of the present invention is that the channel region 15 having a higher impurity concentration than that of the $N^-$ type drift layer 11 is formed at the periphery of the surface of the gate oxide film formed on the sidewall of the trench and extends from the $N^+$ type source layer 13 to the P type electric field relaxation region 16. This configuration prevents the depletion layer 20 spreading from the P type body 12 and the depletion layer 21 spreading from the P type electric field relaxation region 16 from being integrated with each other under the condition that the UMOSFET is in a thermal equilibrium state. The threshold voltage can therefore be reduced. Electrons can be accumulated in the almost entire part of the channel region 15 (which becomes an accumulation region 22 as shown in FIG. 3) even when a drain voltage is high. Thus, a saturation current can be increased. In addition, since a gate voltage can be set to a low value, reliability of the oxide film can be improved.

In the semiconductor device according to the present invention, the first conductivity type (described above) of the semiconductor layers may be either a P type or an N type to achieve the configuration of the semiconductor device. In this case, the second conductivity type (described above) is opposite to the first conductivity type. That is, in embodiments described below, even when the P type is replaced with the N type, and the N type is replaced with the P type, the configuration of the semiconductor device according to the present invention can be achieved.

The embodiments of the present invention will be described in detail with reference to the accompanying drawings.

First Embodiment

Figure 1:
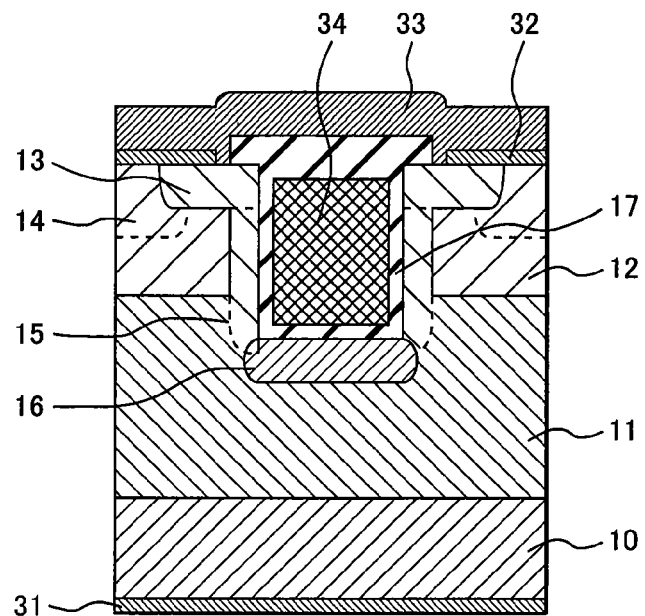
FIG. 1 is an outline cross sectional view of a UMOSFET that is a semiconductor device according to a first embodiment of the present invention.

FIG. 1 is a cross sectional view of a UMOSFET according to a first embodiment of the present invention. FIGS. 5 to 12 are diagrams showing an outline process for forming the UMOSFET according to the first embodiment.

Figure 5:
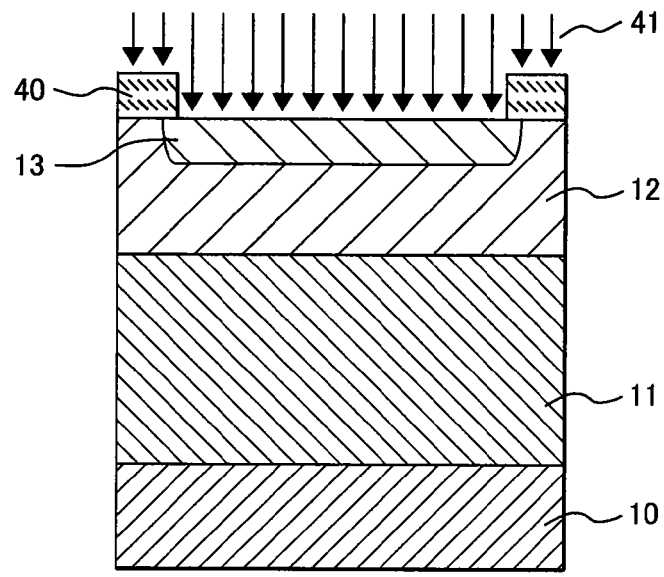
FIG. 5 is an outline cross sectional view of the semiconductor device according to the present invention, which is processed in a first manufacturing process.
Figure 6:
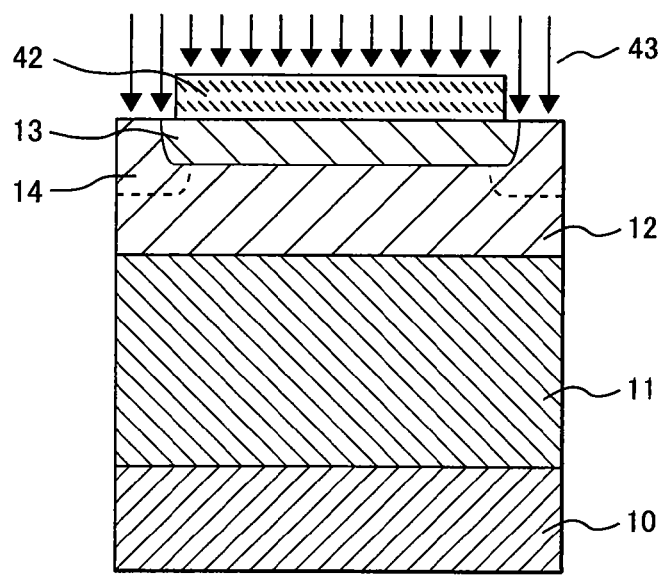
FIG. 6 is an outline cross sectional view of the semiconductor device according to the present invention, which is processed in the next manufacturing process of the process shown in FIG. 5.
Figure 7:
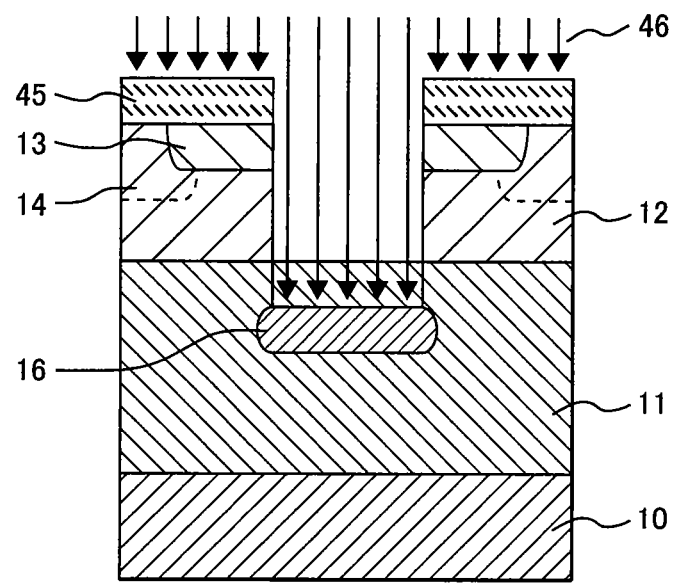
FIG. 7 is an outline cross sectional view of the semiconductor device according to the present invention, which is processed in the next manufacturing process of the process shown in FIG. 6.
Figure 8:
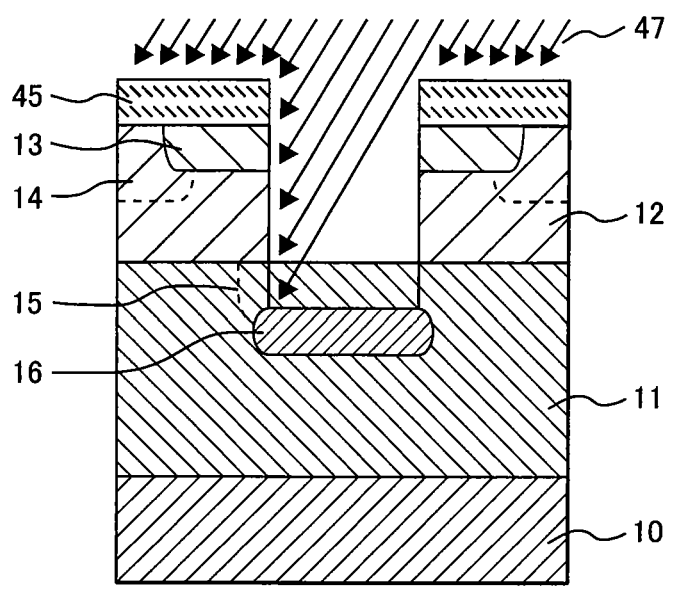
FIG. 8 is an outline cross sectional view of the semiconductor device according to the present invention, which is processed in the next manufacturing process of the process shown in FIG. 7.
Figure 9:
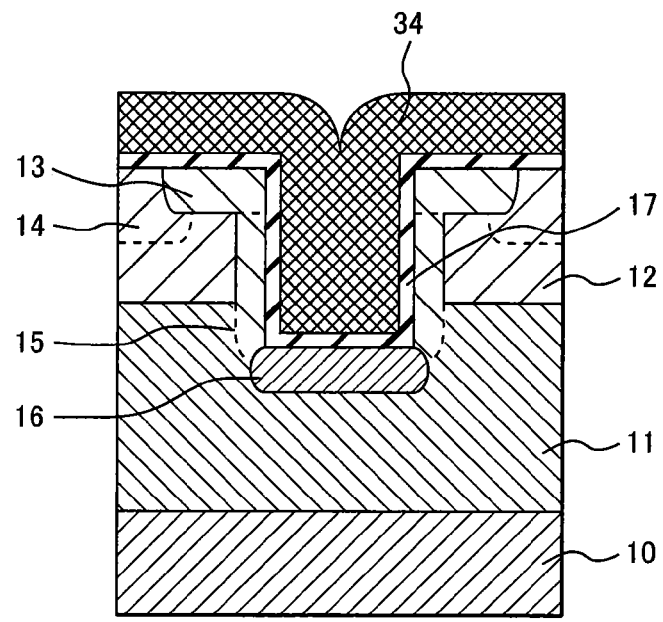
FIG. 9 is an outline cross sectional view of the semiconductor device according to the present invention, which is processed in the next manufacturing process of the process shown in FIG. 8.

As shown in FIG. 5, the $N^-$ type SiC drift layer 11 (having an impurity concentration of $2\times10^{16}$ cm$^{-3}$ and a thickness of 6.5 μm) is provided on the $N^+$ type SiC wafer 10. The P type body 12 (having an impurity concentration of $1\times10^{18}$ cm$^{-3}$ and a thickness of 2.3 μm) is provided on the drift layer 11. The drift layer 11 and the P type body 12 are semiconductor layers. A first mask material 40 for ion implantation is provided on the P type body 12. The first mask material 40 is patterned. Nitrogen ions 41 are implanted into the structure shown in FIG. 5 to form the $N^+$ type SiC source layer 13 (having a peak impurity concentration of $1\times10^{20}$ cm$^{-3}$ and a thickness of 0.3 μm). In the process, an $SiO_2$ film formed by a chemical vapor deposition (CVD) method is used as the mask material.

After the first mask material 40 is removed, a second mask material 42 is formed and patterned into a predetermined shape. Then, aluminum ions 43 are implanted into the prepared laminated semiconductor body (shown in FIG. 6) in order to form the $P^+$ type semiconductor region 14.

After the second mask material 42 is removed, a third mask material 45 is formed and patterned into a predetermined shape. A trench (groove) (having a depth of 2.8 μm) is formed in the prepared laminated semiconductor body by dry etching. Then, aluminum ions 46 are implanted into the laminated semiconductor body (shown in FIG. 7) in order to form the P type electric field region 16 around and outside a bottom portion of the trench without removal of the third mask material 45. Then, nitrogen ions 47 are implanted into the laminated semiconductor body (shown in FIG. 8) from a direction oblique to the sidewall of the trench (at an angle of 45 degrees with respect to the sidewall of the trench) in order to form the channel region 15 (having a peak impurity concentration of $1\times10^{17}$ cm$^{-3}$) on the sidewall of the trench.

In the series of the processes described above, the process for implanting aluminum ions to form the P type electric field relaxation region 16 around and outside the bottom portion of the trench may be performed after the process for implanting nitrogen ions from the oblique direction to form the channel region 15 on the sidewall of the trench is performed.

After the third mask material 45 is removed, a heat treatment is performed at a temperature of 1700° C. to activate the implanted aluminum ions and the implanted nitrogen ions. After the heat treatment, the gate oxide film 17 is formed due to thermal oxidation. Polycrystalline silicon 34 constituting the gate electrode 34 is filled in the trench (refer to FIG. 9).

Figure 10:
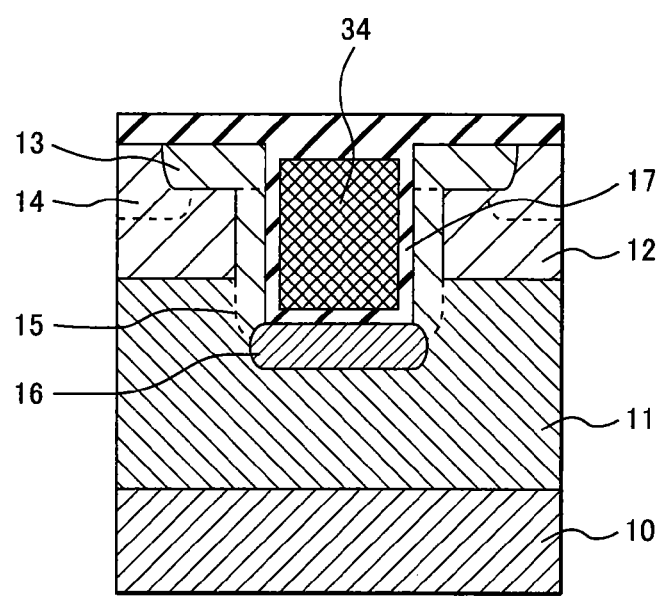
FIG. 10 is an outline cross sectional view of the semiconductor device according to the present invention, which is processed in the next manufacturing process of the process shown in FIG. 5.
Figure 11:
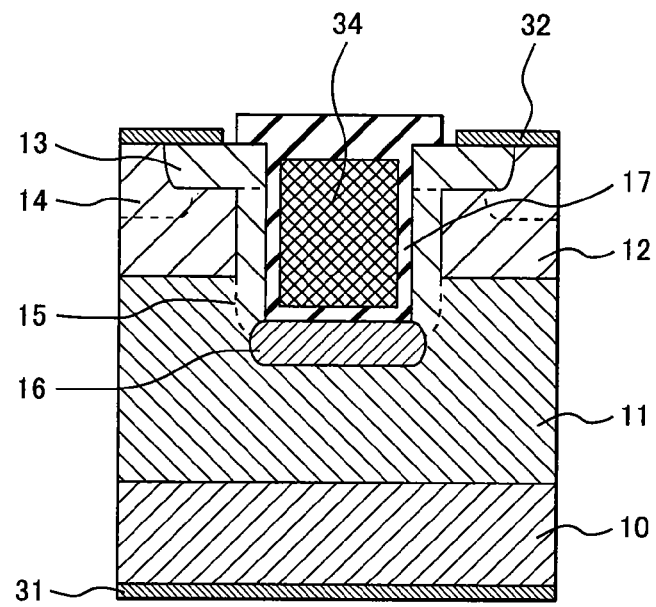
FIG. 11 is an outline cross sectional view of the semiconductor device according to the present invention, which is processed in the next manufacturing process of the process shown in FIG. 6.
Figure 12:
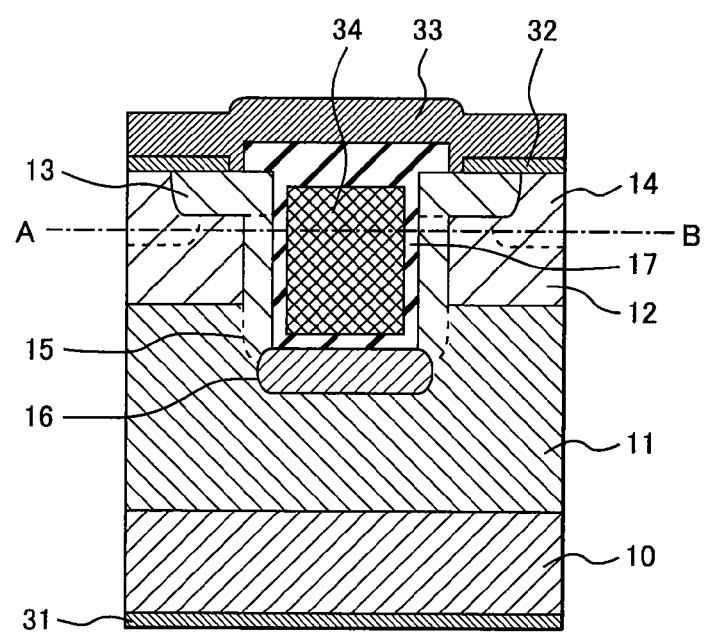
FIG. 12 is an outline cross sectional view of the semiconductor device according to the present invention, which is processed in the next manufacturing process of the process shown in FIG. 7.

The polycrystalline silicon 34 is etched back, and an SiO$_2$ film is formed on the polycrystalline silicon by a CVD method (refer to FIG. 10).

Then, an Ni film is formed on the surface of the N$^+$ type wafer to form the drain electrode 31 and the silicide layer 32. In addition, a contact window is patterned on the surface of the N$^+$ type source layer 13 and on the surface of the P$^+$ type semiconductor region 14. An Ni film is formed on the contact window, and an alloying heat treatment is performed. In this way, the silicide layer 32 is formed on the laminated semiconductor body (refer to FIG. 11).

Then, an aluminum layer is formed on the almost entire surface of the element (laminated semiconductor body) to constitute the source electrode 33. Accordingly, the UMOSFET (shown in FIG. 1) according to the present invention is constructed (refer to FIG. 12).

Since the channel region 15 extends from the N$^+$ type source layer 13 to the P type electric field relaxation region 16 and has an impurity concentration higher than that of the N$^-$ type drift layer 11 and lower than that of the P type body 12, the threshold voltage can be set to a value lower than 10 V and the saturation current can be large. The thus constructed UMOSFET is of normally off type capable of maintaining voltage resistance to a high voltage even when the gate voltage is 0 volts. In the present embodiment, the UMOSFET is resistant to a voltage of 720 volts.

Figure 4:
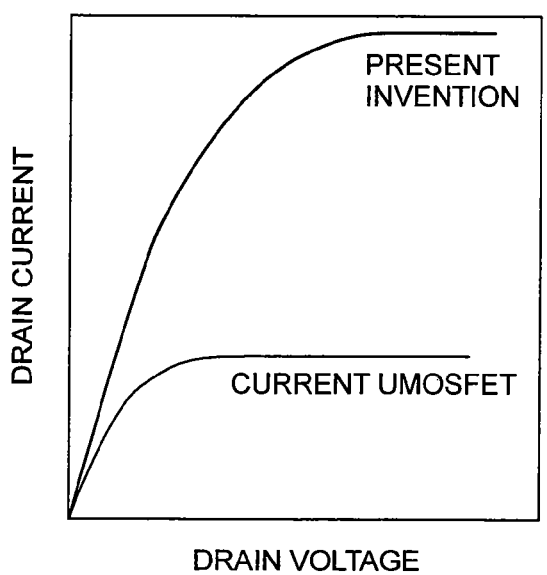
FIG. 4 is a graph showing current versus voltage (I-V) characteristics of the semiconductor device according to the present invention.

FIG. 4 shows a comparison of I-V characteristics of a drain electrode used in a conventional UMOSFET in which a channel region 15 is not formed and I-V characteristics of the drain electrode used in the UMOSFET according to the present embodiment. In the comparison, a voltage of 25 volts is applied to a gate electrode provided in the conventional UMOSFET, and a voltage of 15 volts is applied to the gate electrode provided in the UMOSFET according to the present embodiment. A saturation drain current can be significantly increased while the gate voltage is reduced, compared with the conventional technique.

When the impurity concentration of the channel region 15 is increased, the threshold voltage can be further reduced. When the peak impurity concentration of the channel region 15 is $1\times10^{18}$ cm$^{-3}$, the voltage to which the UMOSFET is resistant is reduced. As described above, the P type body 12 has an impurity concentration of $1\times10^{18}$ cm$^{-3}$. In order to maintain the voltage to which the UMOSFET is resistant, it is preferable that the peak impurity concentration be lower than $1\times10^{18}$ cm$^{-3}$, more practically, $3\times10^{17}$ cm$^{-3}$ or less. From the perspective of the voltage resistance of the semiconductor device, it is more practical that the impurity concentration of the channel region is lower than that of the P type body (i.e., the third semiconductor layer).

Next, a description will be made of the planar configuration of the UMOSFET described above with reference to the layout of the UMOSFET when viewed from the top surface thereof.

Figure 13:
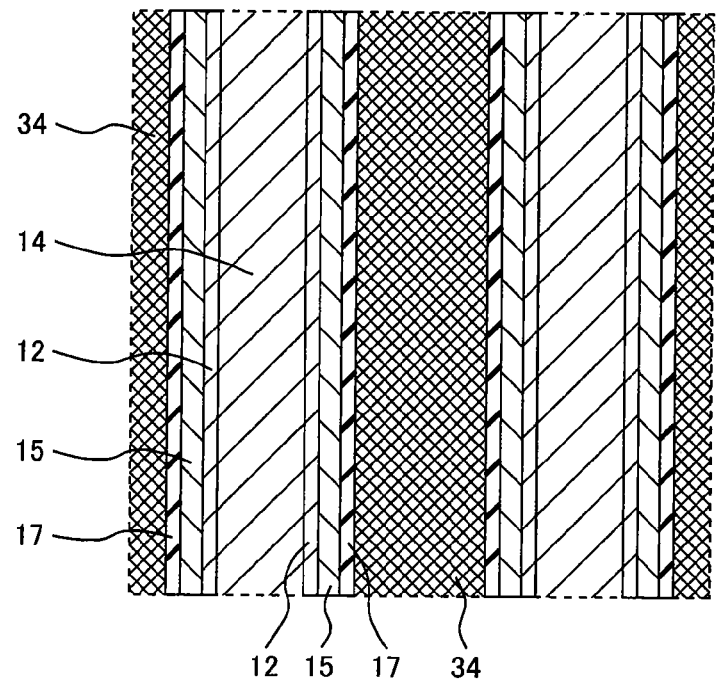
FIG. 13 is a first example of a layout of a semiconductor device according to a first embodiment of the present invention.

FIG. 13 shows a first example of the layout of the UMOSFET. The layout shown in FIG. 13 corresponds to a cross section taken along line A-B of FIG. 12. In FIG. 13, the same reference numerals as those in FIG. 12 indicate the same members as in FIG. 12. In the first example, in order that a potential of the P type body 12 is fixed, the UMOSFET having the layout shown in FIG. 13 has a striped shape. This results from the fact that the regions included in the transistor are arranged side by side, and a mutual impact on the transistors arranged side by side is reduced. The UMOSFET having the layout shown in FIG. 13 does not malfunction during a high speed switching operation and provides a desired output characteristic.

Figure 14:
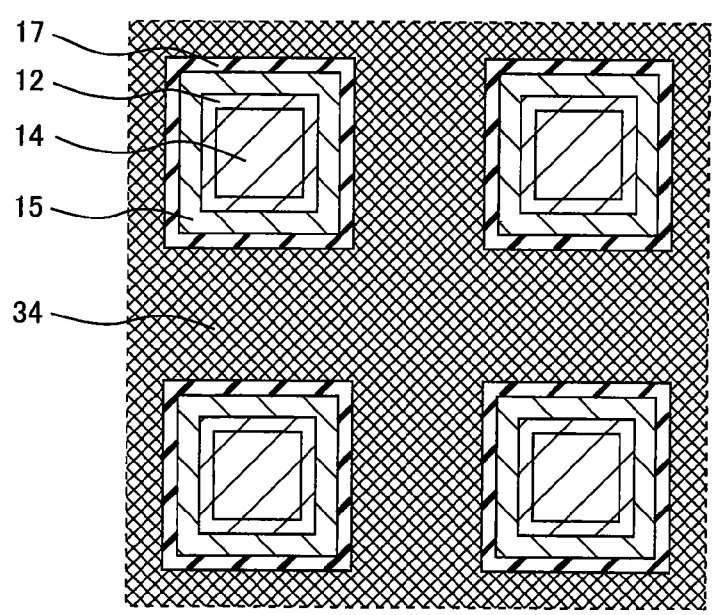
FIG. 14 is a second example of a layout of a semiconductor device according to a first embodiment of the present invention.

FIG. 14 shows a second example of the layout of the UMOSFET. The layout shown in FIG. 14 is obtained when viewed from the top surface of the UMOSFET, similarly to the first example shown in FIG. 13. In the second example, the P type body 12 is quadrangular and surrounded by the trench. A plurality of the P type bodies 12 is provided in the layout shown in FIG. 14 and arranged in a lattice fashion. In the second example, since the channel region 15 extends in four directions, the density of the channel region 15 can be increased and the on-state voltage can be reduced compared with that in the first example shown in FIG. 13. In the second example, however, resistance of the source layer is increased. It is therefore necessary that a switching frequency be lower than that in the first example shown in FIG. 13 for practical use.

Figure 15:
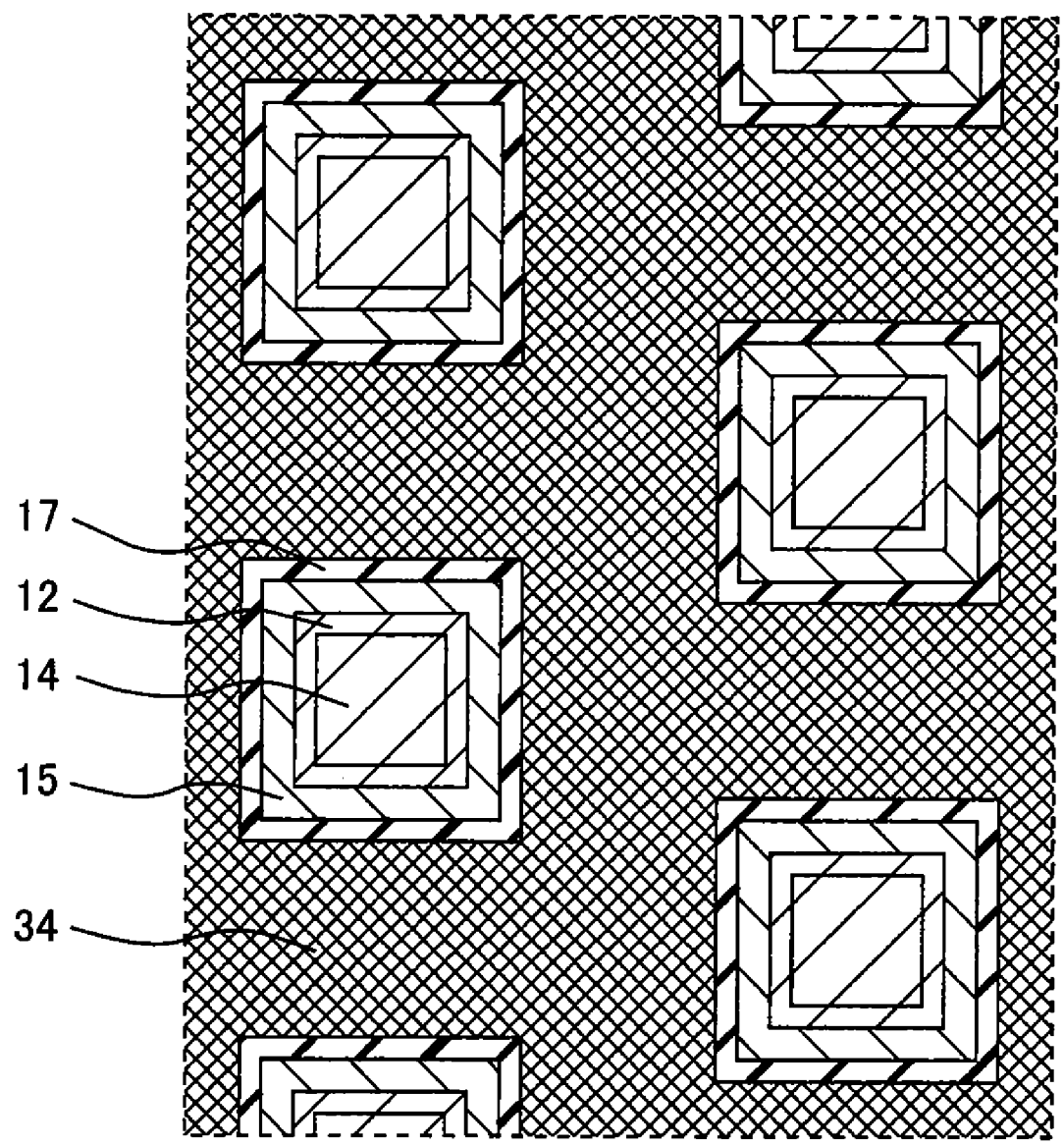
FIG. 15 is a third example of a layout of a semiconductor device according to a first embodiment of the present invention.

FIG. 15 shows a third example of the layout of the UMOSFET. The layout shown in FIG. 15 is obtained when viewed from the top surface of the UMOSFET, similarly to the first example shown in FIG. 13. In the third example, a plurality of the P type bodies 12 is provided and arranged in a zigzag fashion. In the third example, a similar effect to those in the first and second examples can be obtained.

Second Embodiment

Figure 16:
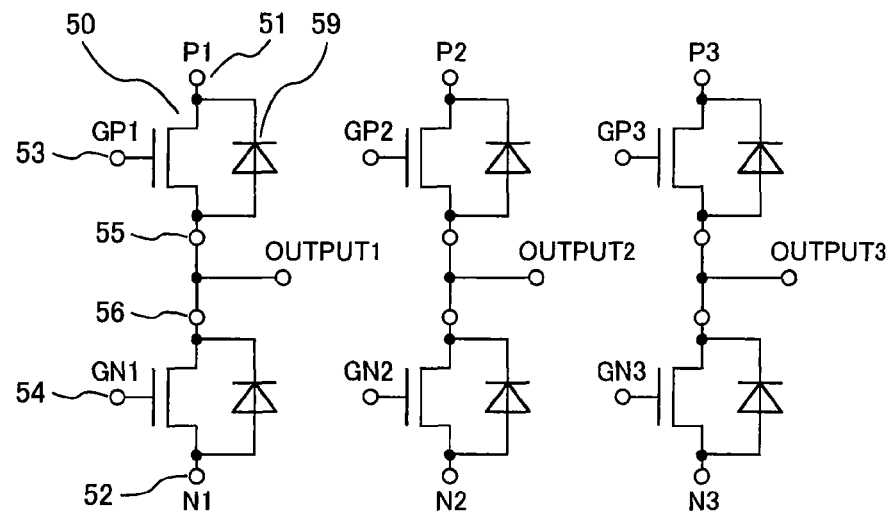
FIG. 16 is a diagram of circuit using a UMOSFET which is a semiconductor device according to a second embodiment of the present invention.
Figure 17:
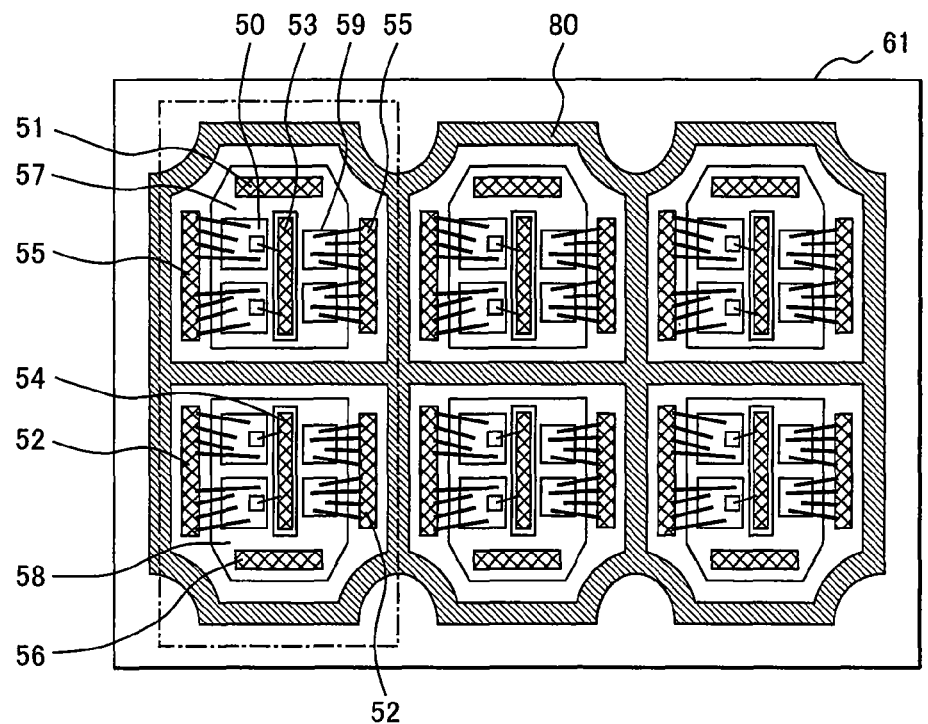
FIG. 17 is a diagram showing an outline structure of a 6-in-1 module corresponding to the circuit diagram shown in FIG. 16.

A circuit and a module, which use the semiconductor device according to the present invention, will be described in a second embodiment of the present invention. FIG. 16 is a diagram showing a circuit using the semiconductor device according to the present invention. The circuit shown in FIG. 16 is a three phase circuit. In FIG. 16, three phases of the circuit, which include outputs 1, 2 and 3, are juxtaposed to each other. FIG. 17 is a diagram showing the configuration of a 6-in-1 module corresponding to the circuit shown in FIG. 16. In FIGS. 16 and 17, the same reference numerals indicate the same members. Reference numeral 61 denotes a base; 50, a UMOSFET according to the present invention; 51, a P-side terminal extractor; 52, an N-side terminal extractor; 53, a P-side gate extractor; 54, an N-side gate extractor; 55, a P-side output extractor; 56, an N-side output extractor; 57, a P-side substrate; 58, an N-side substrate; and 59, a free wheel diode for back flow. FIGS. 16 and 17 show the configuration of a three phase circuit. Each three phase circuit includes outputs 1, 2 and 3. Since each phase of the circuit has the same configuration, one of the phases will be described. That is, the phase including the output 1 shown in FIG. 16 will be described. In FIG. 16, the UMOSFET is indicated by a single symbol. In FIG. 17, two UMOSFETs are arranged side by side.

In FIGS. 16 and 17, the P-side indicates a high voltage side, while the N-side indicates a low voltage side. When a voltage of 15 volts is applied to the P-side gate signal input 53, and a voltage applied to the N-side gate extractor 54 is set to 0 volts, current flows from the P-side input terminal 51 through the UMOSFET 50 and the P-side output extractor 55 to a load (not shown). By individually controlling this operation for each of the UMOSFETs provided in the phases of the circuit, an operation of a three phase inverter is achieved. Since the operation of the inverter is known in general, the description thereof is omitted.

The characteristic of the present invention is that the current capacity per chip is large and the on-state voltage is low. In terms of another characteristic of the present invention, the size of the chip can be reduced compared with a conventional technique by using a current having the same amount flows.

In the present embodiment, the size of the 6-in-1 module can be reduced by half compared with that of a conventional 6-in-1 module.

Third Embodiment

Figure 18:
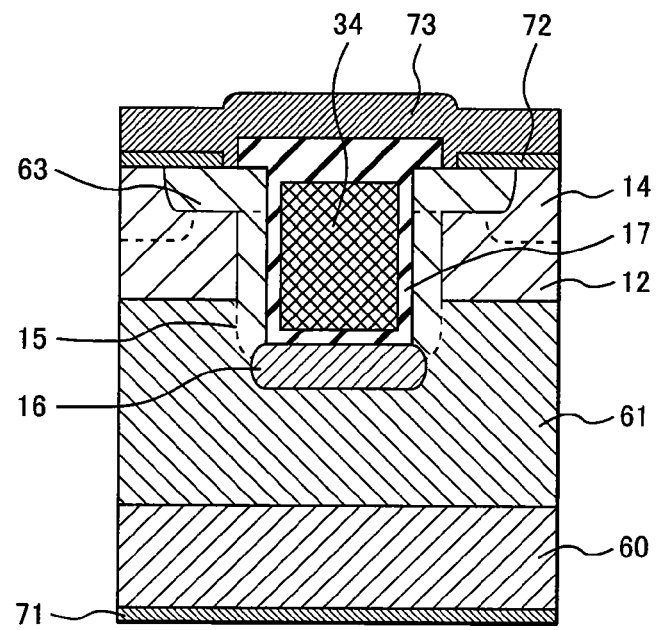
FIG. 18 is an outline cross sectional view of an IGBT included in a semiconductor device according to a third embodiment of the present invention.
Figure 19:
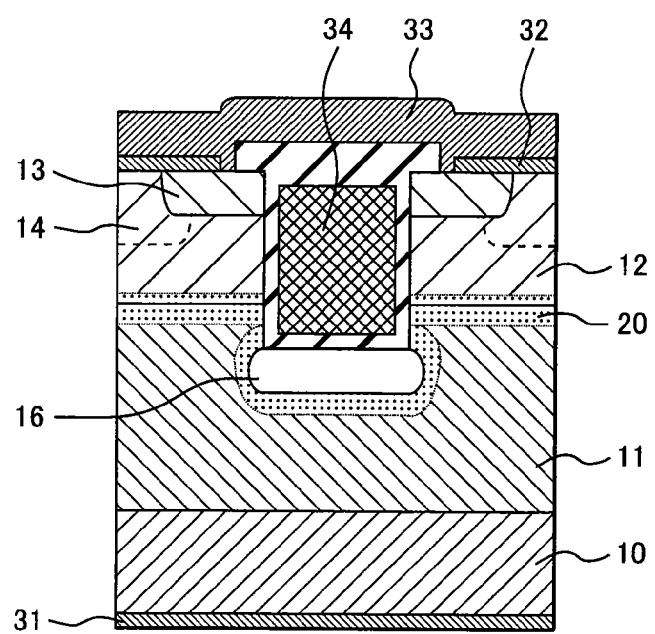
FIG. 19 is an outline cross sectional view of a conventional UMOSFET.

FIG. 18 is a cross sectional view of a SiC-IGBT, which is the semiconductor device according to a third embodiment of the present invention. In FIG. 18, reference numeral 60 denotes a P type SiC wafer; 61, an N type base layer; and 63, an N type emitter layer. In the present embodiment, the present invention is applied to a trench type IGBT. The IGBT is a bipolar transistor in which a MOSFET is embedded in a gate section. The gate section has a similar configuration to that used in the abovementioned embodiments. In the IGBT, a P type body 12 is provided on the N type base layer 61. The N type emitter layer 63 is provided in a portion of the P type body 12. A gate oxide film 17 is provided in a trench. A gate electrode 34 is provided on an inner side of the gate oxide film 17. Reference numeral 14 denotes a $P^+$ type region. The N type emitter layer 63 is connected to an emitter electrode 73 through a silicide layer 72. Reference numeral 15 denotes a channel region. A P type electric field relaxation region 16 is provided around and outside a bottom portion of the trench. Reference numeral 71 denotes a collector electrode which is provided on a lower surface of the P type SiC wafer 60.

The basic configuration and effect of the channel region are similar to those of a conventional channel. The channel region 15 according to the present embodiment extends from the N type emitter layer 63 to the P type electric field relaxation region 16. Therefore, a threshold voltage for turning on the IGBT can be reduced, and an on-state voltage of the IGBT can be reduced.

DESCRIPTION OF REFERENCE NUMERALS

10: $N^+$ type SiC wafer, 11: $N^-$ type drift layer, 12: P type body layer, 13: $N^+$ type source layer, 14: $P^+$ type region, 15: Channel region, 16: P type electric field relaxation region, 17: Gate oxide film, 20, 21: Depletion layer, 22: Accumulation region, 31: Drain electrode, 32: Silicide, 33: Source electrode, 34: Gate electrode, 40, 42, 45: Mask material, 41, 47: Nitrogen ion, 43, 46: Aluminum ion, 50: UMOSFET according to the present invention, 51: P-side terminal extractor, 52: N-side terminal extractor, 53: P-side gate extractor, 54: N-side gate extractor, 55: P-side output extractor, 56: N-side output extractor, 57: P-side substrate, 58: N-side substrate, 59: Free wheel diode, 60: $P^+$ type SiC wafer, 61: Base layer, 63: Emitter layer, 71: Collector layer, 72: Silicide layer, 73: Emitter electrode

What is claimed is:

1. A semiconductor device comprising:
   a first semiconductor layer of a first conductivity type;
   a second semiconductor layer formed on the first semiconductor layer, having a lower impurity concentration than that of the first semiconductor layer, and constituting a drift region of the first conductivity type;
   a third semiconductor layer of a second conductivity type opposite to the first conductivity type, the third semiconductor layer being formed on the second semiconductor layer, a junction being formed between the second semiconductor layer and the third semiconductor layer;
   a fourth semiconductor layer of the first conductivity type, the fourth semiconductor layer being formed on the third semiconductor layer;
   a trench at least extending through the third semiconductor layer and forming a recessed portion connected with the second semiconductor layer;
   an insulating layer formed on a side surface and a bottom surface of the trench;
   a semiconductor region of the second conductivity type, the semiconductor region being formed in the second semiconductor layer and located around and outside a bottom portion of the trench;
   a channel region of the first conductivity type, the channel region being formed on the side surface of the trench, extending from the fourth semiconductor layer to the semiconductor region provided in the second semiconductor layer, and having a higher impurity concentration than that of the second semiconductor layer constituting the drift region; and
   a gate electrode insulated by the insulating layer formed on the side surface and the bottom surface of the trench, at least a part of the gate electrode being formed in the trench.

2. The semiconductor device according to claim 1, wherein a depletion layer spreading from the third semiconductor layer of the second conductivity type to the second semiconductor layer of the first conductivity type and a depletion layer spreading from the semiconductor region of the second conductivity type to the second semiconductor layer are separated from each other in a thermal equilibrium state.

3. The semiconductor device according to claim 1, wherein the first semiconductor layer is a drain region or a source region,
   when the first semiconductor layer is the drain region, the fourth semiconductor layer is a source region, and
   when the first semiconductor layer is the source region, the fourth semiconductor layer is a drain region.

4. The semiconductor device according to claim 1, wherein each of the first to fourth semiconductor layers is made of SiC.

5. The semiconductor device according to claim 1, wherein the impurity concentration of the channel region is lower than that of the third semiconductor layer.

6. The semiconductor device according to claim 2, wherein the first semiconductor layer is a drain region or a source region,
   when the first semiconductor layer is the drain region, the fourth semiconductor layer is a source region, and
   when the first semiconductor layer is the source region, the fourth semiconductor layer is a drain region.

7. The semiconductor device according to claim 2, wherein each of the first to fourth semiconductor layers is made of SiC.

8. The semiconductor device according to claim 2, wherein the impurity concentration of the channel region is lower than that of the third semiconductor layer.

9. The semiconductor device according to claim 1, wherein the first semiconductor layer is a collector region, and the fourth semiconductor layer is an emitter region.

10. The semiconductor device according to claim 9, wherein each of the first to fourth semiconductor layers is made of SiC.

11. The semiconductor device according to claim 9, wherein
the impurity concentration of the channel region is lower than that of the third semiconductor layer.

12. The semiconductor device according to claim 2, wherein
the first semiconductor layer is a collector region, and the fourth semiconductor layer is an emitter region.

13. The semiconductor device according to claim 12, wherein
each of the first to fourth semiconductor layers is made of SiC.

14. The semiconductor device according to claim 12, wherein
the impurity concentration of the channel region is lower than that of the third semiconductor layer.

15. An electrical circuit device includes the semiconductor device according to claim 1.

16. An electrical circuit device includes the semiconductor device according to claim 5.

17. The electrical circuit device according to claim 16, comprising a three phase inverter circuit.

* * * * *